United States Patent
Fujimura et al.

(10) Patent No.: US 7,182,201 B2
(45) Date of Patent: Feb. 27, 2007

(54) WAFER CARRYING APPARATUS AND WAFER CARRYING METHOD

(75) Inventors: Hisashi Fujimura, Chino (JP); Shuji Tanaka, Chino (JP); Yoshitake Kobayashi, Shiojiri (JP); Yasutsugu Aoki, Kofu (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/792,665

(22) Filed: Mar. 3, 2004

(65) Prior Publication Data

US 2004/0238324 A1    Dec. 2, 2004

(30) Foreign Application Priority Data

Mar. 12, 2003  (JP) ............................. 2003-067295

(51) Int. Cl.
*B65G 49/06*  (2006.01)

(52) U.S. Cl. .................................. 198/803.14; 414/935

(58) Field of Classification Search ........... 198/867.11, 198/867.14, 867.15, 803.14, 803.15; 414/935, 414/941
See application file for complete search history.

(56) References Cited

U.S. PATENT DOCUMENTS

| | | | | |
|---|---|---|---|---|
| 4,676,365 A | * | 6/1987 | Noren ..................... | 198/803.14 |
| 5,065,872 A | * | 11/1991 | Simon ......................... | 211/122 |
| 5,113,701 A | * | 5/1992 | Martin .......................... | 118/58 |
| 5,113,785 A | * | 5/1992 | Martin .......................... | 118/58 |
| 5,588,791 A | * | 12/1996 | Akagawa ................. | 414/331.13 |
| 6,223,096 B1 | * | 4/2001 | Nam et al. ................... | 700/213 |
| 6,315,108 B1 | * | 11/2001 | Bootsman et al. ........ | 198/690.1 |
| 6,464,789 B1 | * | 10/2002 | Akimoto ...................... | 118/666 |
| 6,721,626 B2 | * | 4/2004 | Tomita et al. .............. | 700/218 |
| 6,866,140 B2 | * | 3/2005 | Iwasa .................... | 198/803.13 |

FOREIGN PATENT DOCUMENTS

| | | |
|---|---|---|
| JP | 57-112210 A | 7/1982 |
| JP | 61-291326 A | 12/1986 |
| JP | 62-048038 | 3/1987 |
| JP | 02-078243 | 3/1990 |
| JP | 02-117512 | 5/1990 |
| JP | 06-310424 | 11/1994 |
| JP | 3024154 U | 2/1996 |
| JP | 10-150090 | 6/1998 |
| JP | 11-106030 A | 4/1999 |

(Continued)

OTHER PUBLICATIONS

Patent Abstract of Japan regarding Publication No. 62-048038 published Mar. 2, 1987.

(Continued)

*Primary Examiner*—Joe Dillon, Jr.
(74) *Attorney, Agent, or Firm*—Harness, Dickey & Pierce, P.L.C.

(57) ABSTRACT

A wafer carrying apparatus 20 for carrying intermediate products comprises: a conveyer 40 for carrying the intermediate products in the carrying direction; and a plurality of platforms 41 arranged in the conveyer 40 along the carrying direction of the intermediate products on the conveyer 40, each platform 41 being capable of mounting at least one intermediate product at a position in a direction crossing the carrying direction of the intermediate products on the conveyer 40.

2 Claims, 14 Drawing Sheets

FOREIGN PATENT DOCUMENTS

| | | |
|---|---|---|
| JP | 2001-133160 | 5/2001 |
| JP | 2002-237512 | 8/2002 |
| JP | 2002-334917 | 11/2002 |
| JP | 2002/355780 | 12/2002 |
| WO | 2003/000472 A | 1/2003 |

OTHER PUBLICATIONS

Patent Abstract of Japan regarding Publication No. 06-310424 published Nov. 4, 1994.

Patent Abstract of Japan regarding Publication No. 02-078243 published Mar. 19, 1990.

Patent Abstract of Japan regarding Publication No. 02-117512 published May 2, 1990.

Patent Abstract of Japan regarding Publication No. 2002-237512 published Aug. 23, 2002.

Patent Abstract of Japan regarding Publication No. 2002-334917 published Nov. 22, 2002.

Communication from Korean Patent Office re: counterpart application.

Communication from Japanese Patent Office regarding counterpart application.

* cited by examiner

WAFER CARRYING APPARATUS AND WAFER CARRYING METHOD

CROSS REFERENCE TO RELATED APPLICATIONS

This application claims priority to Japanese application No. 2003-067295 filed Mar. 12, 2003, which is hereby incorporated by reference.

DETAILED DESCRIPTION OF THE INVENTION

1. Technical Field of the Invention

The present invention relates to a wafer carrying apparatus and a wafer carrying method for carrying wafers between a plurality of wafer processing apparatuses.

2. Description of the Related Art

Semiconductor manufacturing apparatuses for manufacturing semiconductor wafers (hereinafter, referred to as wafers) include a variety of wafer manufacturing apparatuses, such as lithography apparatuses, film forming apparatuses, etching apparatuses, cleaning apparatuses, test apparatuses, etc.

In manufacturing semiconductors, the wafers are moved between the wafer manufacturing apparatuses and are processed in the respective manufacturing apparatuses, whereby the manufacturing processes continue.

Wafer cassettes are used for moving the wafers between the wafer manufacturing apparatuses. The wafer cassettes detachably store a plurality of wafers (for example, see Japanese Unexamined Patent Application Publication No. 62-48038).

On the other hand, because of the requirement for limited production of a wide variety of wafers, a so-called wafer carrying method of carrying wafers on a conveyer one by one rather than by using wafer cassettes has been disclosed. This wafer carrying method is intended to cope with the requirement for limited production of a variety of wafers (for example, see Japanese Unexamined Patent Application Publication No. 2002-334917).

In the conventional wafer carrying method, since wafers are to be mounted sequentially on the conveyer, the wafers are horizontally arranged in spaced relationship on the conveyer. Therefore, since only a number of wafers corresponding to the length of the conveyer may be mounted on the conveyer, the carrying amount of wafers on the conveyer is limited. Further, when the wafers are mounted on the conveyer using the conventional wafer carrying method, both the spacing pitches between adjacent wafers and the diameters of the wafers should be predetermined, thereby precluding enhancement of the carrying amount of wafers.

Therefore, the present invention is designed to solve the above problems, and it is thus an object of the present invention to provide a wafer carrying apparatus and a wafer carrying method capable of enhancing the carrying amount of intermediate products, such as wafers, on a conveyer, thereby enhancing the wafer carrying efficiency of the intermediate products.

SUMMARY OF THE INVENTION

According to an aspect of the present invention, there is provided a wafer carrying apparatus for carrying intermediate products, comprising: a conveyer for carrying the intermediate products in a carrying direction; and a plurality of platforms arranged on the conveyer along the carrying direction of the intermediate products on the conveyer, each platform being capable of having mounted upon it at least one intermediate product at a position in a direction crossing the carrying direction of the intermediate products on the conveyer.

As a result, each of the plurality of platforms on the conveyer can have mounted upon it at least one intermediate product at the position in the direction crossing the carrying direction of the intermediate products on the conveyer.

For this reason, it is possible to enhance the carrying amount of intermediate products on the conveyer. Therefore, it is possible to enhance the wafer carrying efficiency of the intermediate products.

Further, by allowing intermediate products to be selectively mounted on an arbitrary platform of the plurality of platforms, the following merits can be obtained. That is, since the intermediate products have different degrees of contamination depending upon the processes of manufacturing apparatuses, the intermediate products are selectively mounted on specific platforms in accordance with the degree of contamination or the kind of process. As a result, it is possible to prevent contaminants from more contaminated intermediate products from being transferred to the intermediate products having low degrees of contamination or being clean after a cleaning process.

In the above construction, it is preferable that each platform have an intermediate product holding unit for detachably holding one intermediate product, and that the intermediate product holding unit hold the intermediate product to be inclined with respect to the carrying direction of the intermediate products on the conveyer.

Accordingly, the intermediate product holding unit holds the intermediate product to be inclined with respect to the carrying direction of the intermediate products on the conveyer. For this reason, it is possible to enhance the carrying amount of intermediate products on the conveyer, compared with a case where the intermediate products are horizontally mounted on the conveyer.

In the above construction, it is also preferable that each platform have a plurality of intermediate product holding units, each of which detachably holds one intermediate product, that the plurality of intermediate product holding units be arranged with a gap in a direction crossing the carrying direction of the intermediate products on the conveyer, and that each intermediate product holding unit hold the intermediate product to be inclined with respect to the carrying direction of the intermediate products on the conveyer.

Accordingly, each platform has a plurality of intermediate product holding units, each of which holds the intermediate product to be inclined with respect to the carrying direction of the intermediate products on the conveyer. For this reason, it is possible to enhance the carrying amount of intermediate products on the conveyer, compared with a case where the intermediate products are horizontally mounted on the conveyer.

In the above construction, it is also preferable that each platform have a plurality of intermediate product holding units, each of which detachably holds one intermediate product, that the plurality of intermediate product holding units be arranged in a direction crossing the carrying direction of the intermediate products on the conveyer, and that each intermediate product holding unit hold the intermediate product to be parallel to the carrying direction of the intermediate products on the conveyer.

Accordingly, each platform has a plurality of intermediate product holding units, each of which holds the intermediate product to be parallel to the carrying direction of the intermediate products on the conveyer. For this reason, it is possible to enhance the carrying amount of intermediate products on the conveyer, compared with a case where only one intermediate product is horizontally mounted on the conveyer.

In the above construction, it is also preferable that the intermediate products be electronic component manufacturing substrates or wafers for the substrates, and that the direction crossing the carrying direction of the intermediate products on the conveyer be an upward direction perpendicular to the carrying direction of the intermediate products on the conveyer.

Accordingly, the electronic component manufacturing substrates or wafers for the substrates, which are intermediate products, are arranged along the upward direction perpendicular to the carrying direction. Therefore, it is possible to enhance the carrying amount of electronic component manufacturing substrates or wafers for the substrates on the conveyer.

The electronic components mentioned above representatively include semiconductor devices, liquid crystal display devices, and crystal oscillators.

According to another aspect of the present invention, there is provided a wafer carrying method for carrying intermediate products, the method comprising: an intermediate product mounting step in which at least one intermediate product is mounted on each of a plurality of platforms at a position in a direction crossing a carrying direction of the intermediate products on a conveyer, the conveyer carrying the intermediate products in the carrying direction, the plurality of platforms being arranged in the conveyer along the carrying direction of the intermediate products on the conveyer; and an intermediate product moving step in which the intermediate products are situated to face manufacturing apparatuses thereof by moving the plurality of platforms on which the intermediate products are mounted by way of the conveyer.

As a result, in the intermediate product mounting step, at least one intermediate product is mounted on each of the plurality of platforms at a position in a direction crossing the carrying direction of the intermediate products on the conveyer, the conveyer carrying the intermediate products in the carrying direction, the plurality of platforms being arranged in the conveyer along the carrying direction of the intermediate products on the conveyer.

Accordingly, it is possible to enhance the carrying amount of the intermediate products on the conveyer, compared with a case where the intermediate products are horizontally mounted on the conveyer. Therefore, it is possible to enhance the wafer carrying efficiency of the intermediate products.

Further, in the intermediate product moving step, the intermediate products are situated to face the manufacturing apparatuses thereof by moving the plurality of platforms on which the intermediate products are mounted by way of the conveyer. Therefore, it is possible to enhance the carrying amount of intermediate products on the conveyer and to enable the intermediate products to face the manufacturing apparatuses.

In the above construction, it is preferable that each platform have an intermediate product holding unit for detachably holding one intermediate product, and that the intermediate product holding unit hold the intermediate product to be inclined with respect to the carrying direction of the intermediate products on the conveyer.

Accordingly, the intermediate product holding unit holds the intermediate product to be inclined with respect to the carrying direction of the intermediate products on the conveyer. For this reason, it is possible to enhance the carrying amount of intermediate products on the conveyer, compared with a case where the intermediate products are horizontally mounted on the conveyer.

In the above construction, it is also preferable that each platform have a plurality of intermediate product holding units, each of which detachably holds one intermediate product, that the plurality of intermediate product holding units be arranged with a gap in a direction crossing the carrying direction of the intermediate products on the conveyer, and that each intermediate product holding unit hold the intermediate product to be inclined with respect to the carrying direction of the intermediate products on the conveyer.

Accordingly, each platform has a plurality of intermediate product holding units, each of which holds the intermediate product to be inclined with respect to the carrying direction of the intermediate products on the conveyer. For this reason, it is possible to enhance the carrying amount of intermediate products on the conveyer, compared with a case where the intermediate products are horizontally mounted on the conveyer.

In the above construction, it is also preferable that each platform have a plurality of intermediate product holding units, each of which detachably holds one intermediate product, that the plurality of intermediate product holding units be arranged in a direction crossing the carrying direction of the intermediate products on the conveyer, and that each intermediate product holding unit hold the intermediate product to be parallel to the carrying direction of the intermediate products on the conveyer.

Accordingly, each platform has a plurality of intermediate product holding units, each of which holds the intermediate product to be parallel to the carrying direction of the intermediate products on the conveyer. For this reason, it is possible to enhance the carrying amount of intermediate products on the conveyer, compared with a case where only one intermediate product is horizontally mounted on the conveyer.

In the above construction, it is also preferable that the intermediate products be electronic component manufacturing substrates or wafers for the substrates, and that the direction crossing the carrying direction of the intermediate products on the conveyer be an upward direction perpendicular to the carrying direction of the intermediate products on the conveyer.

Accordingly, the electronic component manufacturing substrates or wafers for the substrates, which are intermediate products, are arranged along the upward direction perpendicular to the carrying direction. Therefore, it is possible to enhance the carrying amount of electronic component manufacturing substrates or wafers for the substrates on the conveyer.

The electronic components mentioned above representatively include semiconductor devices, liquid crystal display devices, and crystal oscillators.

DETAILED DESCRIPTION OF THE PREFERRED EMBODIMENTS

Figure 1:
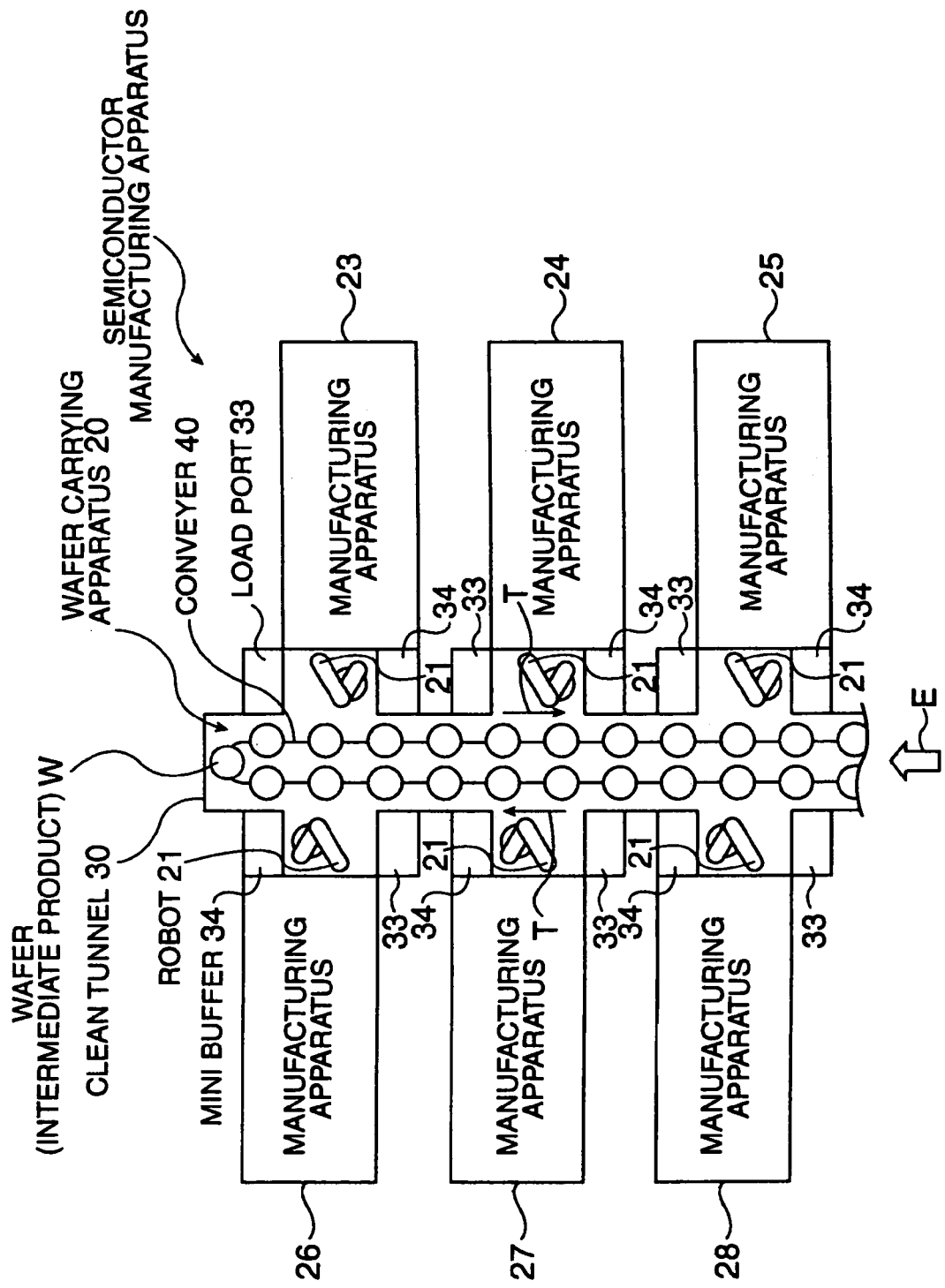
FIG. 1 is a plan view showing a part of a semiconductor manufacturing apparatus including a wafer carrying apparatus according to the present invention.
Figure 2:
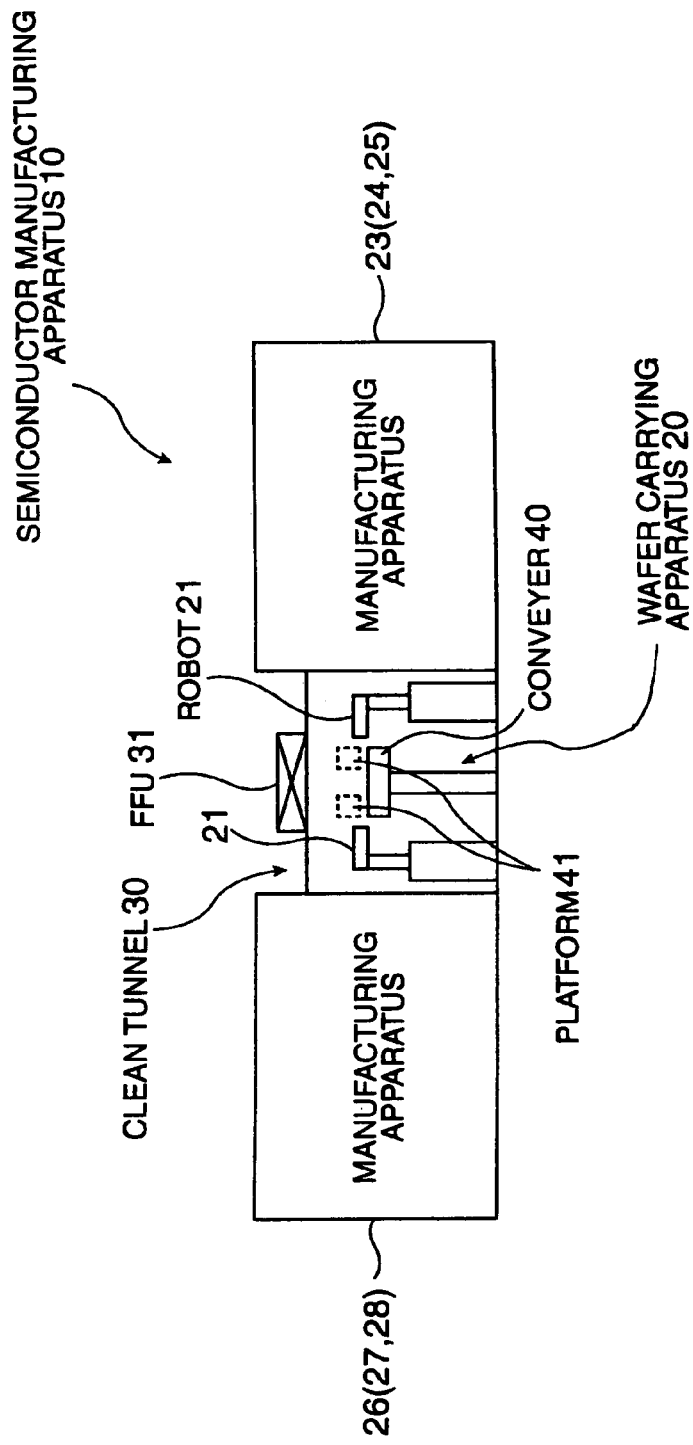
FIG. 2 is a side view of the semiconductor manufacturing apparatus of FIG. 1 as seen from a direction E.

FIG. 1 is a plan view showing an example of a semiconductor manufacturing apparatus including a first preferred embodiment of a wafer carrying apparatus according to the present invention. FIG. 2 is a side view of the semiconductor manufacturing apparatus of FIG. 1 as seen from a direction E. The semiconductor manufacturing apparatus 10 has a wafer carrying apparatus 20, a plurality of robots 21, and a plurality of manufacturing apparatuses 23 through 28.

Intermediate products in the semiconductor manufacturing apparatus 10 shown in FIG. 1 are semiconductor wafers (hereinafter, referred to as wafers W). The manufacturing apparatuses 23 through 28 shown in FIGS. 1 and 2 include a variety of wafer manufacturing apparatuses, such as a lithography apparatus, a film forming apparatus, an etching apparatus, a cleaning apparatus, and a test apparatus, and are arranged in a necessary order. The manufacturing apparatuses 23 through 28 may be referred to as processing apparatuses or producing apparatuses.

The wafer carrying apparatus 20 shown in FIGS. 1 and 2 is partitioned with a clean tunnel 30. This clean tunnel 30 partitions a space through which the wafers W pass into a very small, closed space.

The clean tunnel 30 has a plurality of filter units (FFU) 31 to which fans are attached. The fan-attached filter unit 31 is provided on the ceiling of the clean tunnel 30. The fan-attached filter unit 31 generates airflow (down-flow) from the ceiling to below the bottom, so that dust in the air is removed to manage the inside of the clean tunnel 30 within a defined cleanliness level (cleanliness class).

A load port 33 and a mini buffer (may be referred to as a buffer) 34 are provided between each processing apparatus 23 through 28 and the wafer carrying apparatus 20. A robot 21 is provided between the load port 33 and the mini buffer 34. A vessel capable of detachably housing the wafers W is mounted on the load port 33. Accordingly, the wafers W are manually supplied.

The robot 21, also referred to as a transfer robot, transfers the wafers W carried by the wafer carrying apparatus 20 to the manufacturing apparatus, or transfers the wafers W to the mini buffer 34 and then transfers the wafers W in the mini buffer 34 to the manufacturing apparatus. In addition, the robot 21 transfers the wafers W in the manufacturing apparatus to the mini buffer 34 and returns the wafers W in the mini buffer 34 to the wafer carrying apparatus 20. Furthermore, the robot 21 transfers the wafers W housed in the vessel mounted on the load port 33 to the manufacturing apparatus, or returns the wafers W in the manufacturing apparatus to the vessel mounted on the load port 33.

Figure 3:
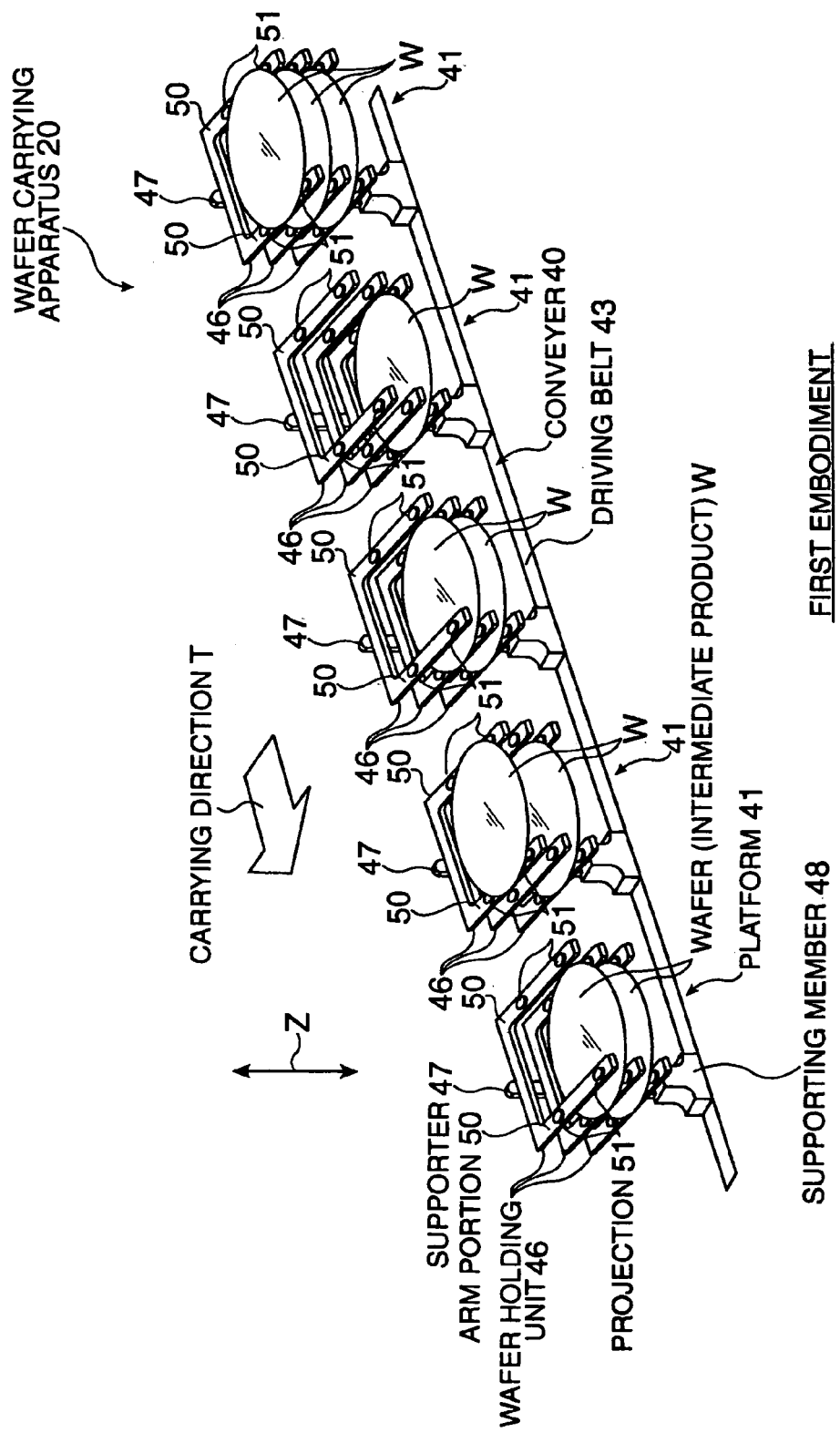
FIG. 3 is a perspective view showing a specific structure of the wafer carrying apparatus.

FIG. 3 is a view specifically showing a part of the wafer carrying apparatus 20 shown in FIG. 1.

The wafer carrying apparatus 20 has a conveyer 40 and a plurality of platforms 41.

The conveyer 40 is an apparatus for continually carrying the wafers W in the carrying direction T. The platforms 41 are arranged at equally spaced intervals, for example, on a driving belt 43 of the conveyer 40 in the carrying direction T.

Figure 4:
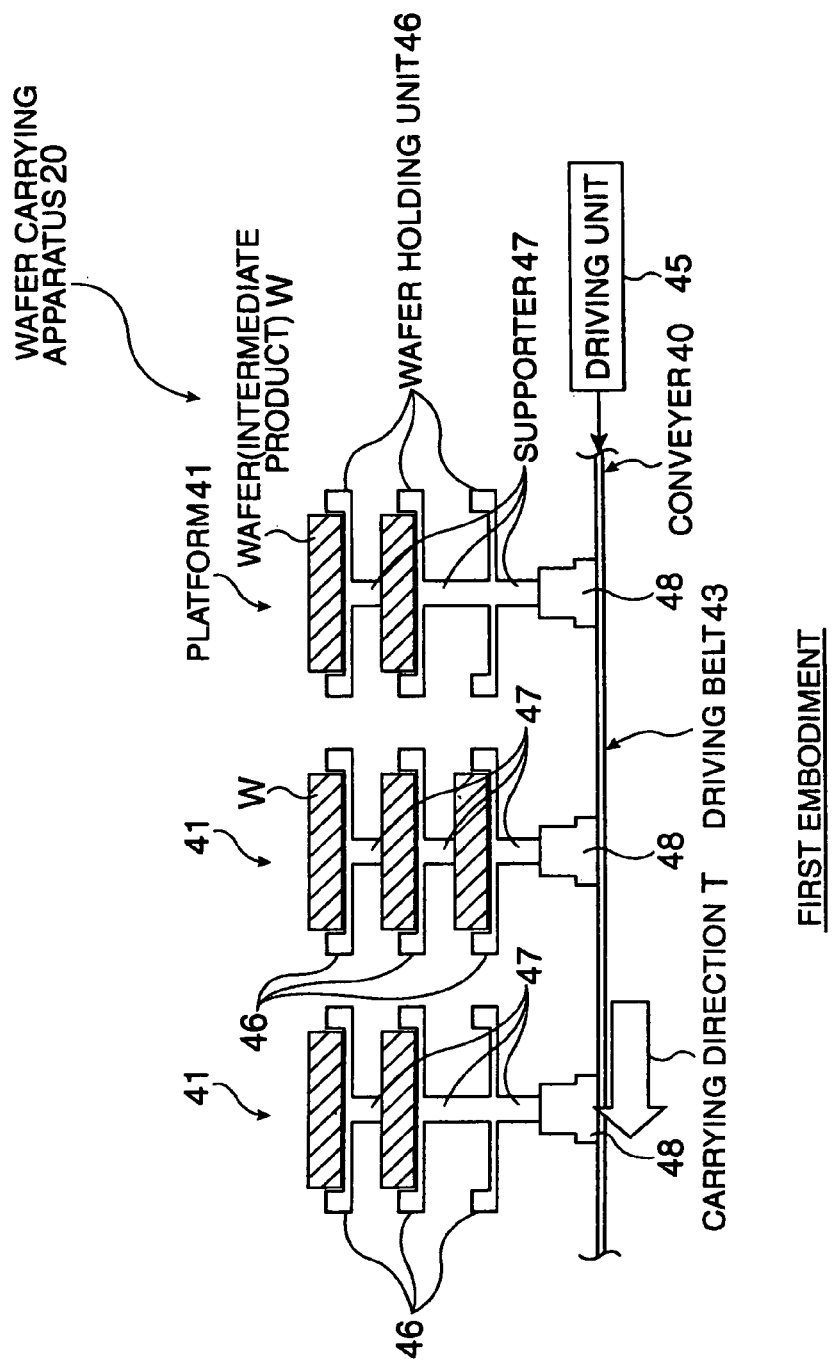
FIG. 4 is a side view of the wafer carrying apparatus of FIG. 3.

FIG. 4 is a side view showing a schematic structure of the wafer carrying apparatus 20 shown in FIG. 3.

As shown in FIG. 4, the respective platforms 41 can move at equally spaced intervals in the carrying direction T by means of the movement of the driving belt 43. The driving belt 43 is moved by means of the force of a driving unit 45 shown in FIG. 4.

Each platform 41 can have mounted upon it at least one sheet of wafers W. Specifically, as shown in FIGS. 3 and 4, each platform 41 has three wafer holding units 46. As shown in FIG. 3, the wafer holding units 46 are stacked and arranged in equally spaced intervals in a Z direction by means of a supporter 47. The Z direction is a direction crossing the carrying direction T of the wafers W on the conveyer 40, preferably above the driving belt 43 and perpendicular to the carrying direction T.

Each platform 41 has a supporter 47 and three wafer holding units 46 as described above. The supporter 47 is connected and fixed to the driving belt 43 through a supporting member 48 shown in FIG. 3. As a result, the supporter 47 is vertically supported. The supporting member 48 can be stably moved in the carrying direction T by means of the driving belt 43.

Each wafer holding unit 46 shown in FIG. 3 has a substantial U shape and includes two arm portions 50 parallel to each other. Each arm portion 50 is provided with two projections 51. The resulting four projections 51 of the two arm portions 50 support an outer circumferential edge of a wafer W. As a result, even when the wafer W is carried in the carrying direction T shown in FIG. 3, the wafer does not move in each wafer holding unit 46.

Each wafer holding unit 46 holds the wafer W to be parallel to the carrying direction T. Since each platform 41 has a plurality of wafer holding units, that is, three wafer holding units 46 stacked on top of each other, as in the illustrated example, it is possible to enhance the carrying amount of wafers using each platform 41. That is, compared with a conventional case where the wafers are horizontally mounted side by side and carried one by one with a spacing pitch on the conveyer, the carrying amount of or number of wafers transported by the conveyor can increase, for example, by a maximum of three times in the above embodiment of the present invention.

The wafer holding units 46 of the platforms 41 shown in FIGS. 3 and 4 do not have to hold the wafers W horizontally in the carrying direction T. However, in order to reduce the structure of the wafer carrying apparatus 20 including the conveyer 40 and the plurality of platforms 41, it is preferable that the wafers W be held horizontally.

The number of stages of the wafer holding units 46 in the Z direction is three in FIGS. 3 and 4, but may really be two, or four or more. It is more preferable that each wafer holding unit 46 be detachably fixed to the supporter 47 as needed. As a result, it is possible to adjust the carrying amount of wafers in the wafer carrying apparatus 20.

As shown in FIGS. 3 and 4, the wafers W are arbitrarily mounted in the wafer holding units 46. That is, an example in which the wafers are not mounted on some of the wafer holding units 46 is illustrated.

The number of stages of the wafer holding units on which the processed wafers are mounted should be predetermined in accordance with the kinds of the manufacturing apparatuses used for processing the wafers as shown in FIG. 1, or with the details of the processes. As a result, a wafer W having a relatively large degree of contamination processed in a manufacturing apparatus and a wafer W having a relatively small degree of contamination or being clean after a cleaning process processed in another manufacturing apparatus can be prevented from being mounted on the wafer holding unit 46, lying at a position of the same number of stages of the same position. Therefore, there is merit in that contaminants are not transferred from a wafer having a large degree of contamination to a wafer having a small degree of contamination or being clean.

Figure 5:
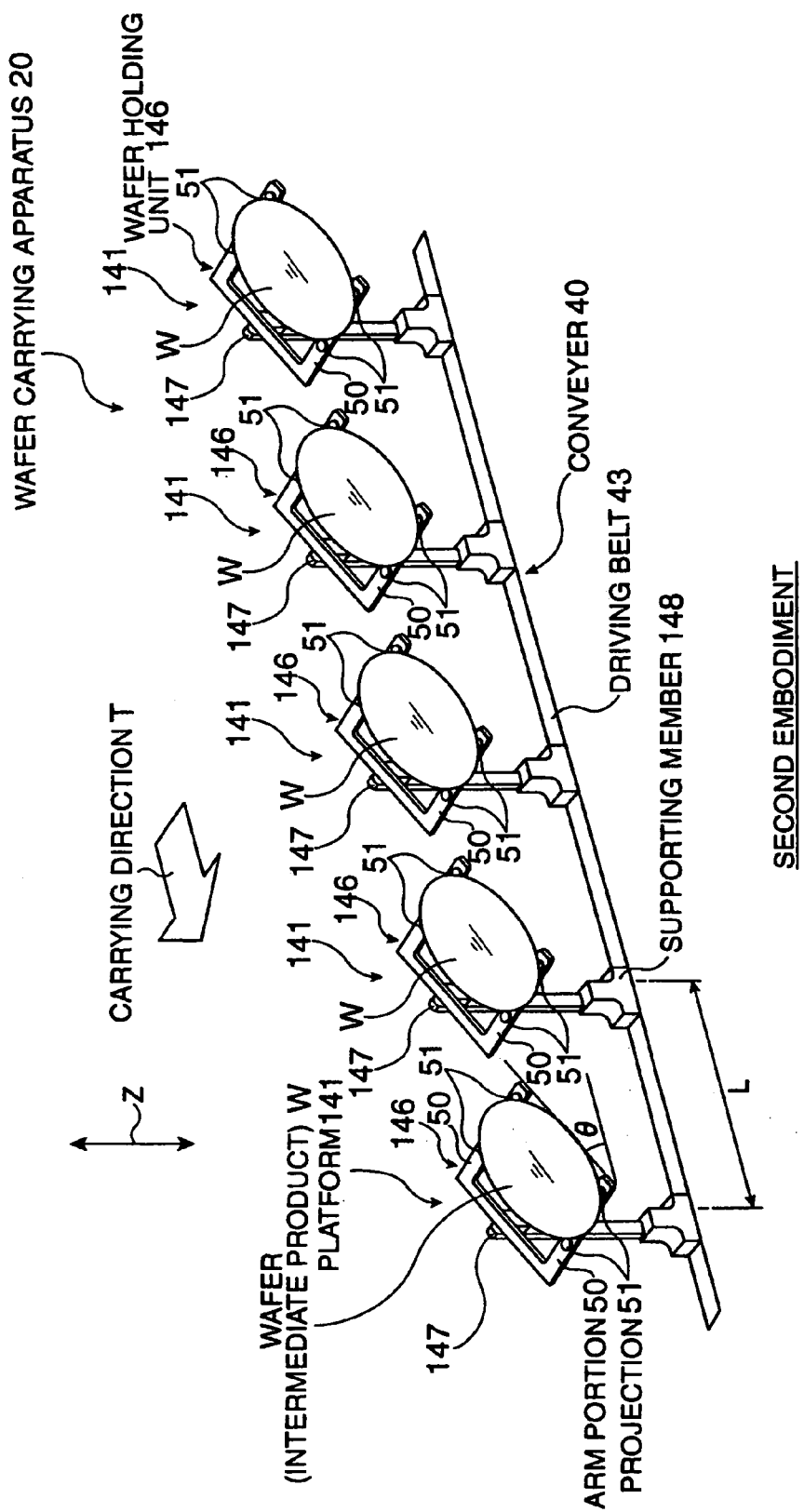
FIG. 5 is a perspective view showing another embodiment of the wafer carrying apparatus according to the present invention.

FIGS. 5 and 6 show a second embodiment of the wafer carrying apparatus 20 according to the present invention.

Figure 6A:
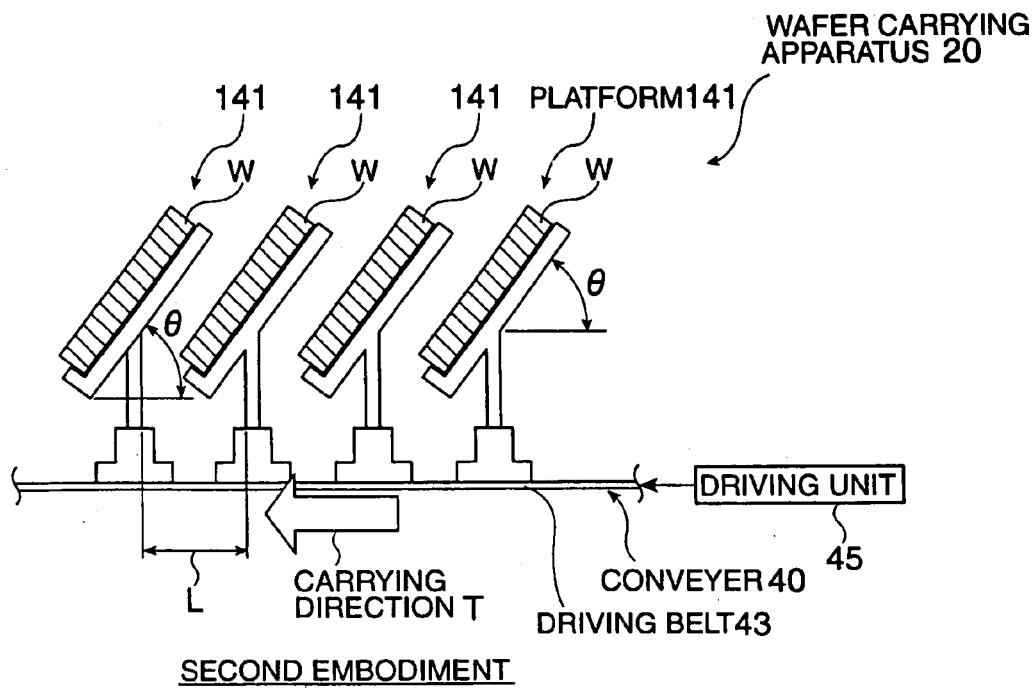
FIG. 6 is a side view of the wafer carrying apparatus of FIG. 5 and another embodiment thereof.

In FIGS. 5 and 6(A), a plurality of platforms 141 is arranged in equally spaced relationship in the driving belt 43. The driving belt 43 for driving the platforms 141 can be moved in the carrying direction T by means of the force of the driving unit 45 shown in FIG. 6.

Each platform 141 has a supporter 147 and one wafer holding unit 146. The supporter 147 is supported by a supporting member 148. The supporter 147 is provided in an upward direction perpendicular to the longitudinal direction of the driving belt 43, that is, the carrying direction T.

However, this embodiment is characterized in that the wafer holding units 146 are arranged to be tilted or inclined at an angle θ with respect to the carrying direction T. This angle θ is, for example, an angle less than 45°, but may be an angle more than 45° and less than 90°.

Since the wafer holding units 146 are inclined with respect to the carrying direction T and the supporter 147, the following merit can be obtained, compared with a case where the wafer holding units 146 hold the wafers W in the horizontal direction parallel to the carrying direction T. That is, since the wafer holding units 146 are inclined, the gap L between the platforms 141 can be smaller than the gap in a case where the wafer holding units are arranged horizontally. As a result, the number of platforms, which can be arranged on one conveyer 40, can increase.

Therefore, compared with a conventional case where the wafers are horizontally mounted and carried one by one with a spacing pitch on the conveyer, it is possible to accomplish enhancement of the carrying amount of wafers W.

The other elements of the wafer carrying apparatus 20 according to the second embodiment shown in FIGS. 6(A) and 5 are similar to the corresponding elements of the wafer carrying apparatus 20 shown in FIGS. 3 and 4, and thus descriptions thereof will be omitted.

Figure 6B:
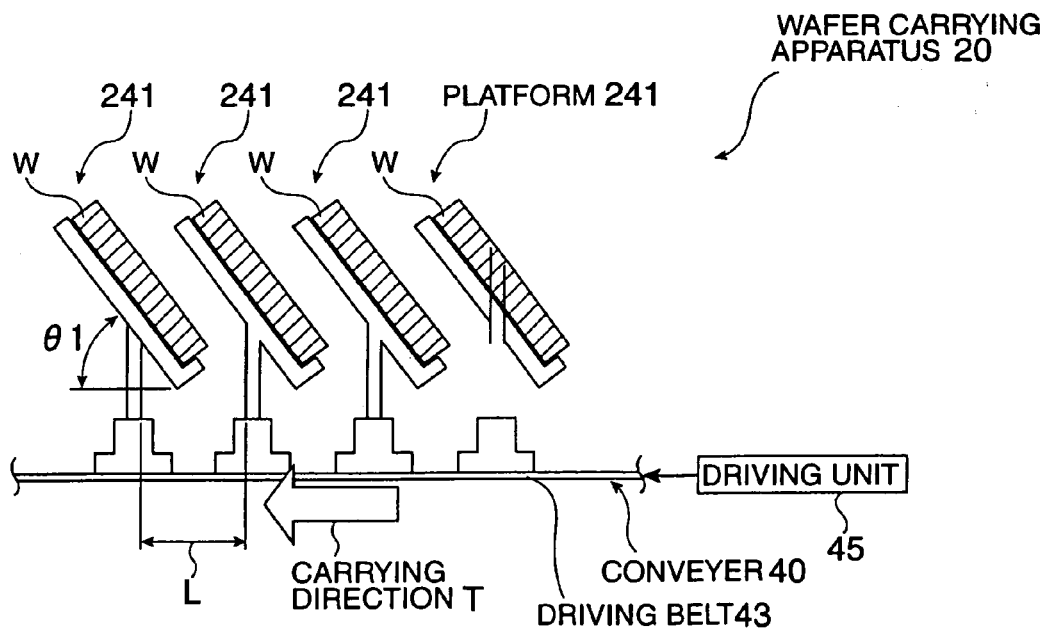

FIG. 6(B) shows a third embodiment of the wafer carrying apparatus 20 according to the present invention.

The wafer carrying apparatus 20 shown in FIG. 6(B) is different from the wafer carrying apparatus 20 shown in FIG. 6(A) in the following ways. The platforms 241 shown in FIG. 6(B) are arranged to be inclined at an angle θ1 with respect to the carrying direction T. The platforms 241 shown in FIG. 6(B) are arranged to be reversely inclined with respect to the platforms 141 shown in FIG. 6(A).

When such a structure is employed, it is also possible to allow the gap L between adjacent platforms 241 to be smaller than the gap in a case where the platforms are arranged horizontally.

The other elements of the wafer carrying apparatus 20 shown in FIG. 6(B) are similar to the corresponding elements of the wafer carrying apparatus 20 shown in FIGS. 6(A), 3 and 4 and thus descriptions thereof will be omitted.

Figure 7:
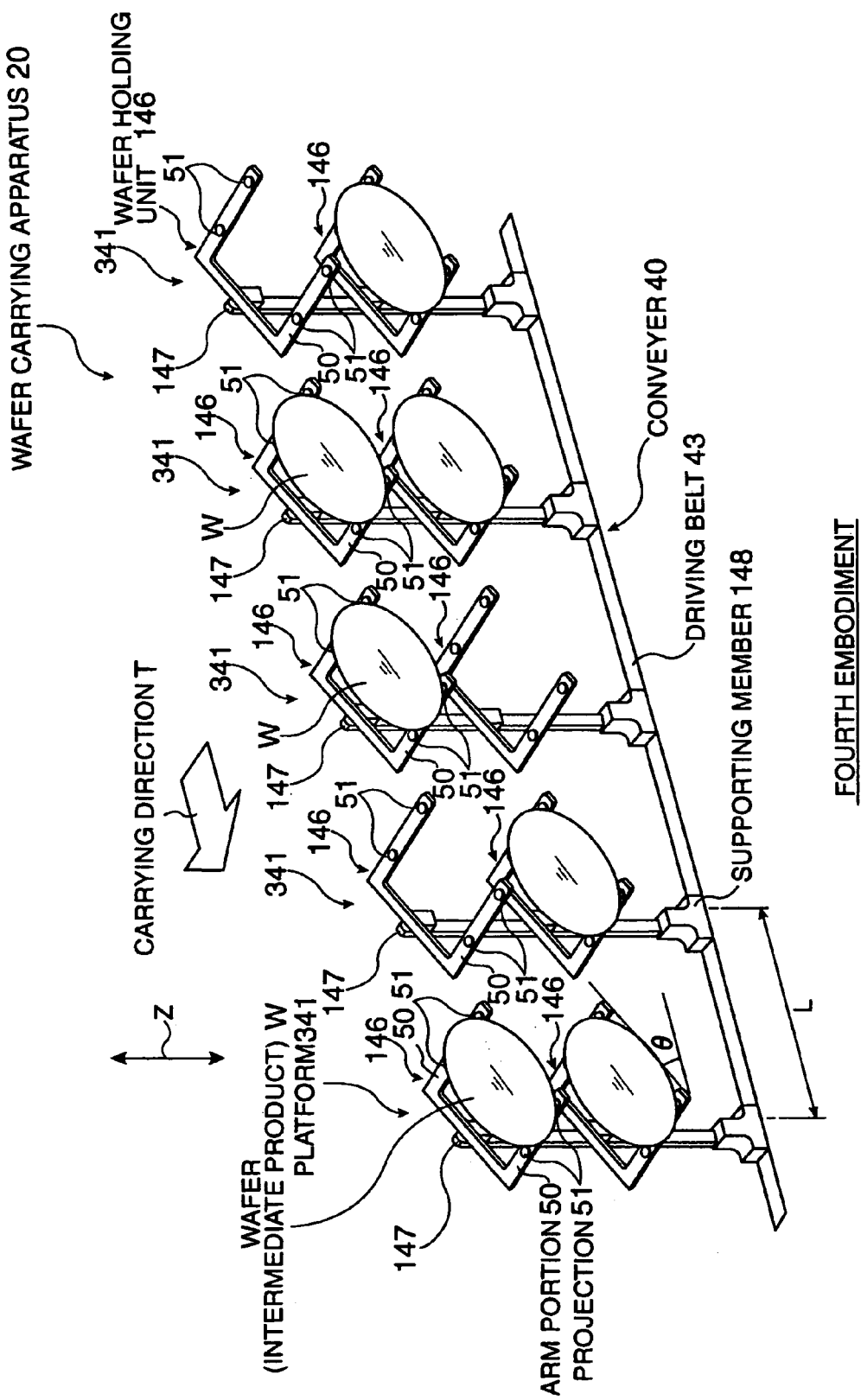
FIG. 7 is a perspective view showing another embodiment of the wafer carrying apparatus according to the present invention.
Figure 8A:
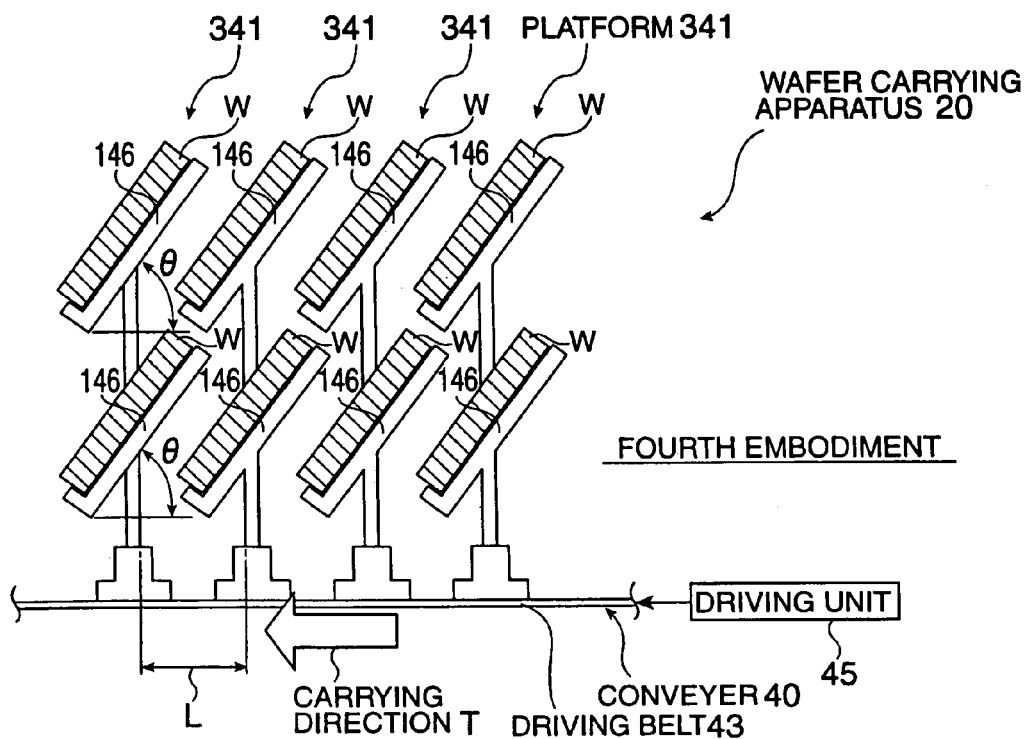
FIG. 8 is a side view of the wafer carrying apparatus of FIG. 7 and another embodiment thereof.

FIGS. 7 and 8(A) show a fourth embodiment of the wafer carrying apparatus 20 according to the present invention.

The wafer carrying apparatus 20 shown in FIG. 7 is different from the wafer carrying apparatus 20 shown in FIGS. 5, 6(A) and 6(B) in the following ways.

For example, in each platform 141 of FIG. 5, only one wafer holding unit 146 is provided. On the contrary, in the fourth embodiment of FIG. 7, a plurality of wafer holding units, for example, two wafer holding units 146 are arranged to be inclined on each platform 341. The two wafer holding units 146 are attached to a supporter 147. The supporter 147 is supported in the Z direction by means of a supporting member 148.

In the embodiment shown in FIG. 7, the wafers W can be mounted on an arbitrary stage of wafer holding unit 146 on each platform 341.

As a result, as described above, the wafer holding units 146 on which the wafers should be mounted can be selected in accordance with the degree of contamination of wafers. Therefore, contaminants are not transferred from a wafer with a large degree of contamination to a wafer with a small degree of contamination or a clean wafer.

Figure 8B:
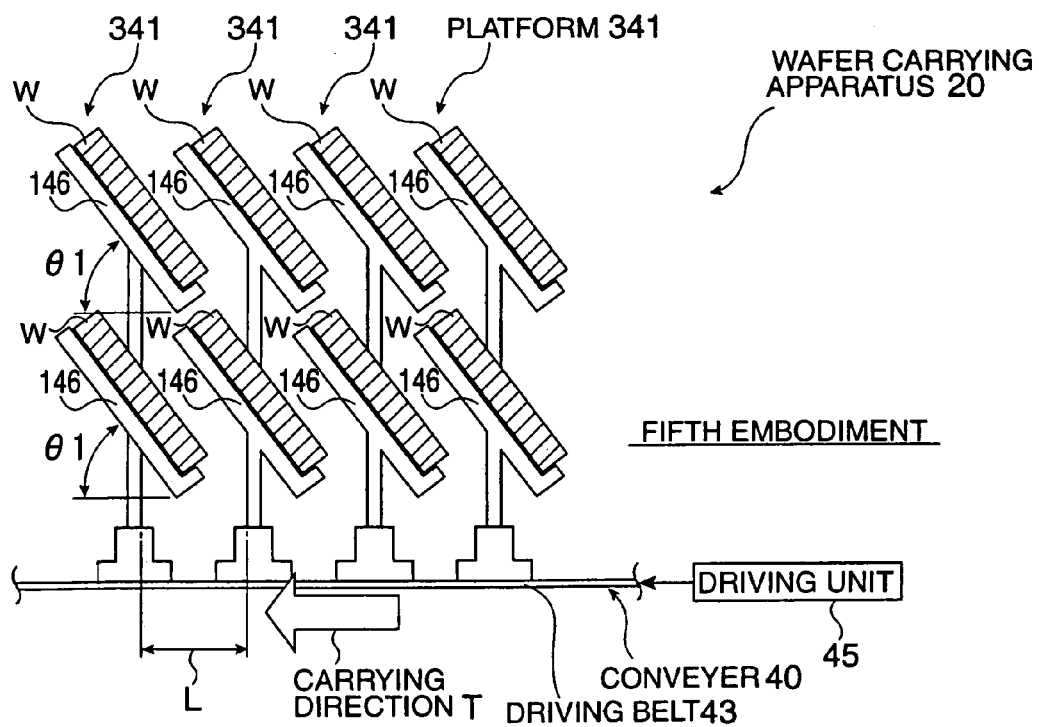

FIG. 8(A) is a side view showing the wafer carrying apparatus 20 according to the fourth embodiment of FIG. 7. In FIGS. 7 and 8(A), the respective platforms 146 are inclined at an angle θ. On the contrary, in a fifth embodiment of FIG. 8(B), the respective platforms 146 are reversely inclined at an angle θ1.

By employing the wafer carrying apparatus 20 shown in FIGS. 7 and 8, compared with the wafer carrying apparatus 20 shown in FIG. 5, it is possible to decrease the distance L between adjacent platforms, and, in addition, to enhance the carrying amount of wafers.

Figure 9:
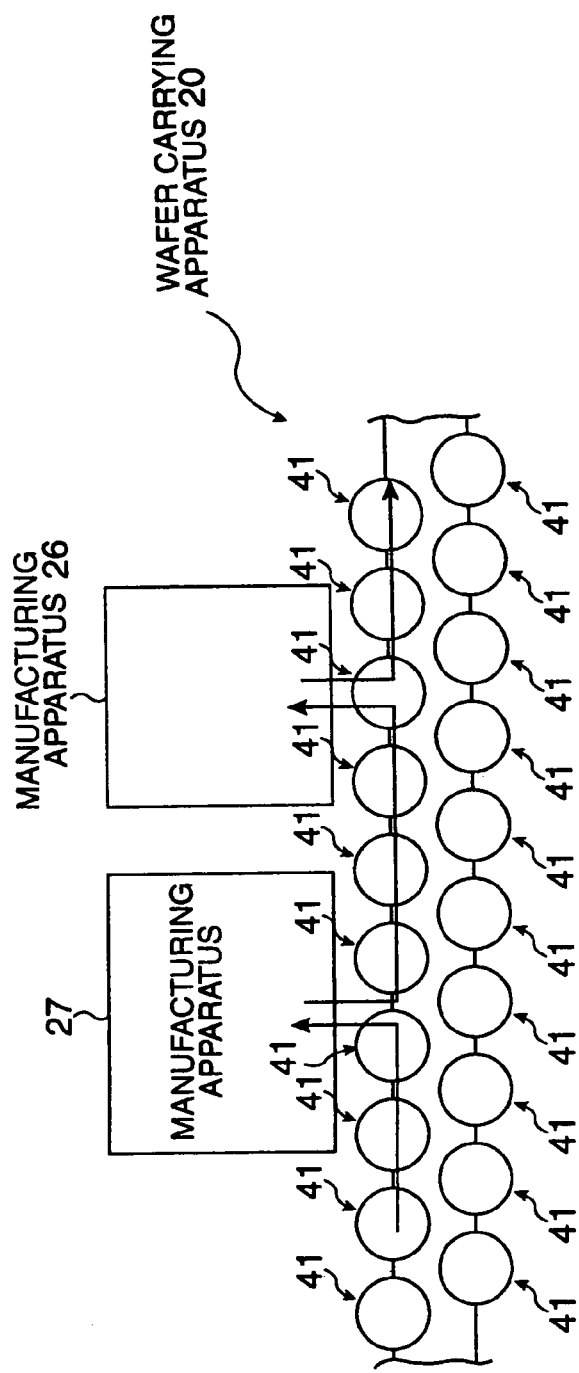
FIG. 9 is a diagram showing the wafer carrying apparatus according to the present invention and peripheral processing apparatuses thereof.

FIG. 9 shows representatively the wafer carrying apparatus 20, and a manufacturing apparatus 27 and a manufacturing apparatus 26, as examples.

Suppose that the manufacturing apparatus 27 is an etching apparatus and the manufacturing apparatus 26 is a cleaning apparatus. Consider that a wafer W carried by the wafer carrying apparatus 20 is processed in the manufacturing apparatus 27 and is then processed in the manufacturing apparatus 26.

In this case, the wafer W processed in the manufacturing apparatus 27 is carried while being held by the wafer holding unit of the wafer carrying apparatus 20 to the manufacturing apparatus 26 and is subjected to a cleaning process. Thereafter, the wafer W is loaded again on a wafer holding unit of the wafer carrying apparatus 20.

At this time, the wafer W, taken from the manufacturing apparatus 27, which is an etching apparatus, is relatively contaminated due to reattachment of etching substances or etchant gas residues, etc.

Another wafer W cleaned in the cleaning apparatus 26 is loaded on the wafer holding unit having had the wafer which has the relatively large degree of contamination. Therefore, attachments, such as particles or contaminants, are transferred to the cleaned wafer W, thereby rendering the cleaning process on the wafer W useless.

Figure 10:
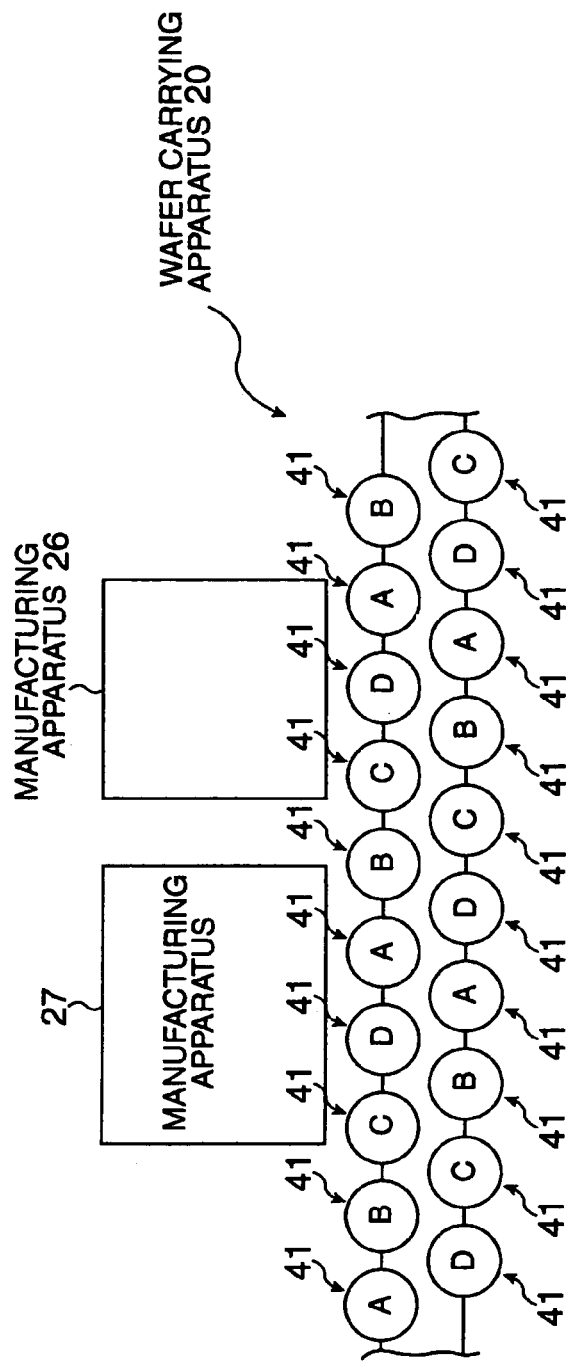
FIG. 10 is a diagram showing an example of using the wafer carrying apparatus according to the present invention and the processing apparatuses thereof.

Accordingly, as shown in FIG. 10, it is preferable to employ a method in which wafer holding units are selectively used to load wafers W in accordance with details of the processes carried out on the wafers W. Therefore, it is possible to prevent contamination of the wafers W or attachment of particles thereto.

For example, as shown in FIG. 10, the arranged platforms 41 shown in FIG. 3 are sequentially discriminated into kinds A, B, C, and D. Platforms 41 indicated by reference numeral 'A' are loaded with, for example, wafers W processed in the manufacturing apparatus 27 that is an etching apparatus. On the contrary, platforms 41 indicated by reference numeral 'B' are loaded with wafers W subjected to the cleaning process in the manufacturing apparatus 26 that is a cleaning apparatus. Platforms 41 indicated by reference numeral 'C' are loaded with wafers subjected to a process in a manufacturing apparatus not shown. Platforms 41 indicated by reference numeral 'D' are loaded with wafers subjected to a process in another manufacturing apparatus not shown.

Accordingly, by discriminating and loading the processed wafers on the platforms in accordance with the kind of manufacturing apparatuses used or with the details of the processes, there is merit in that attachment of particles or transfer of contaminants from a wafer having a large degree of contamination to a wafer having a small degree of contamination or being clean after cleaning does not occur.

Figure 11:
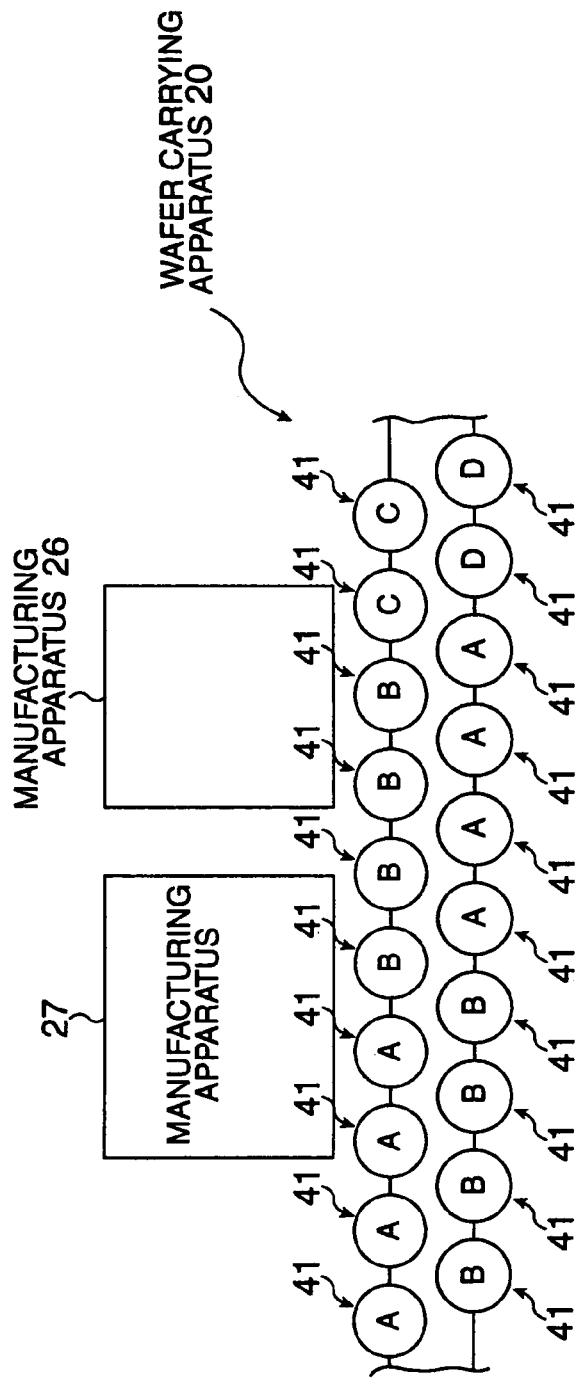
FIG. 11 is a diagram showing an example of using the wafer carrying apparatus according to the present invention and the processing apparatuses thereof.

FIG. 11 shows a modification of FIG. 10, wherein the platforms 41 indicated by the reference numeral 'A' are successively arranged, and the platforms 41 indicated by the reference numeral 'B' are successively arranged. Similarly, the platforms 41 indicated by the reference numeral 'C' are successively arranged, and the platforms 41 indicated by the reference numeral 'D' are successively arranged.

Figure 12:
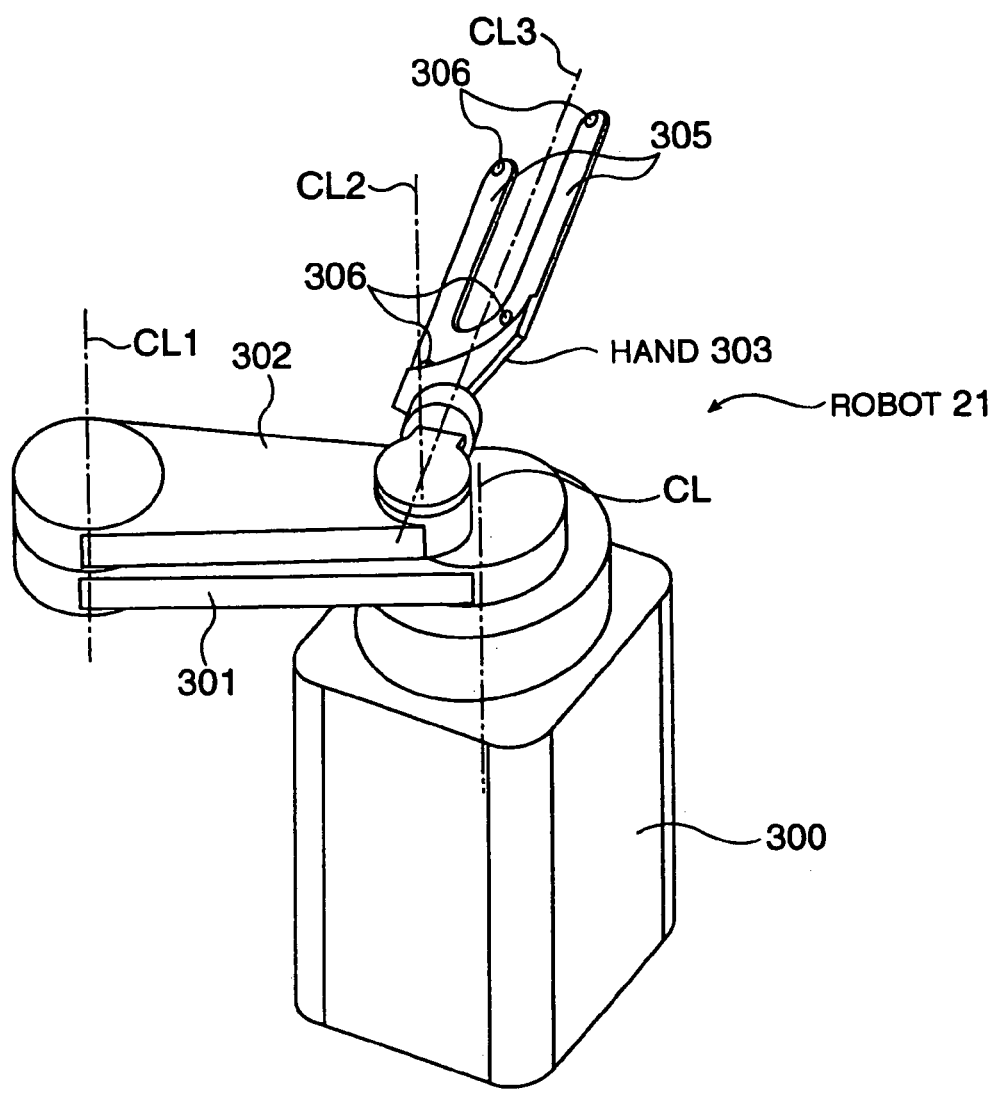
FIG. 12 is a perspective view showing an example of a robot used in the present invention.
Figure 13:
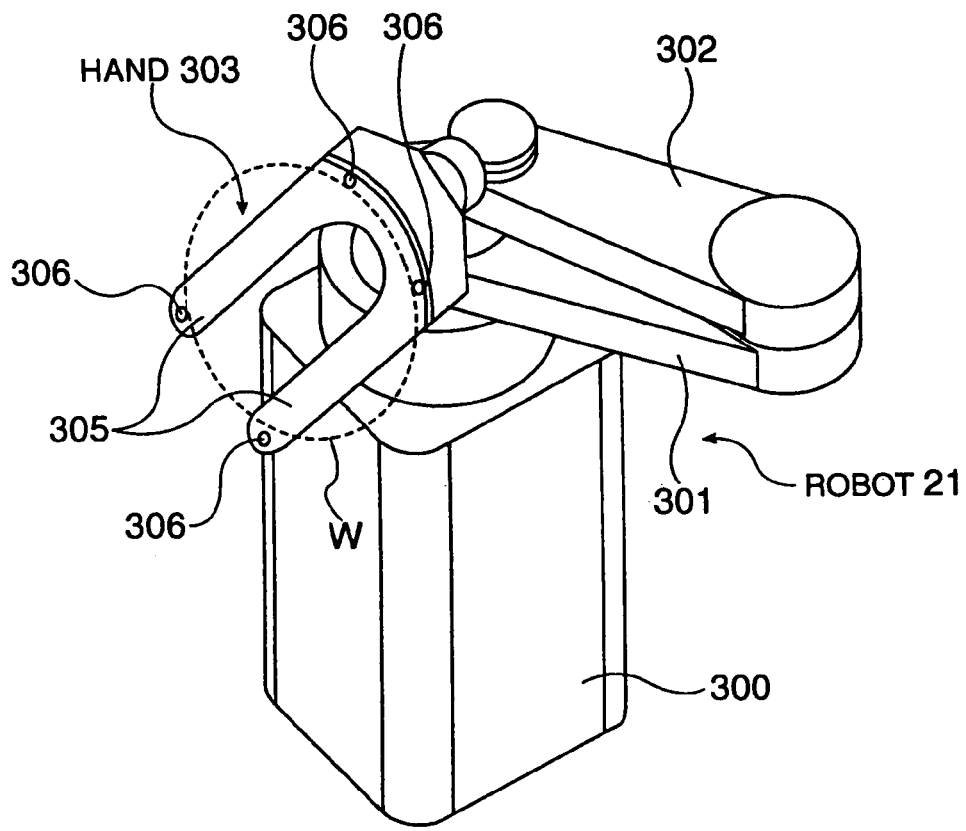
FIG. 13 is a perspective view of the robot of FIG. 12 as seen from another angle.

FIGS. 12 and 13 show a specific example of the robot 21 shown in FIG. 1.

The robot 21 has a main body 300, a first arm 301, a second arm 302, and a hand 303. The first arm 301 is rotatable about a central axis CL of the main body 300. The second arm 302 is rotatable about a rotary axis CL1 of the first arm 301. The hand 303 is rotatable about a rotary axis CL2 and about a rotary axis CL3.

The hand 303 has substantially U-shaped arm portions 305. The arm portions 305 have supporting portions 306 for holding the outer circumferential surface of a wafer W.

Figure 14:
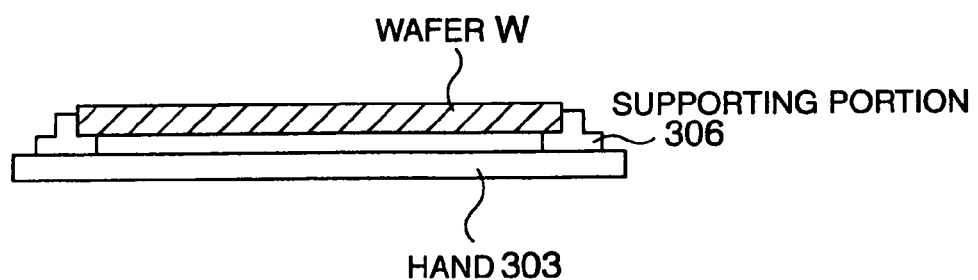
FIG. 14 is a diagram showing a wafer put on a hand of the robot of FIG. 13.

FIG. 14 shows the hand 303 of the robot 21 shown in FIGS. 12 and 13. The supporting portions 306 of the hand 303 support the outer circumferential portion of the wafer W.

Figure 15:
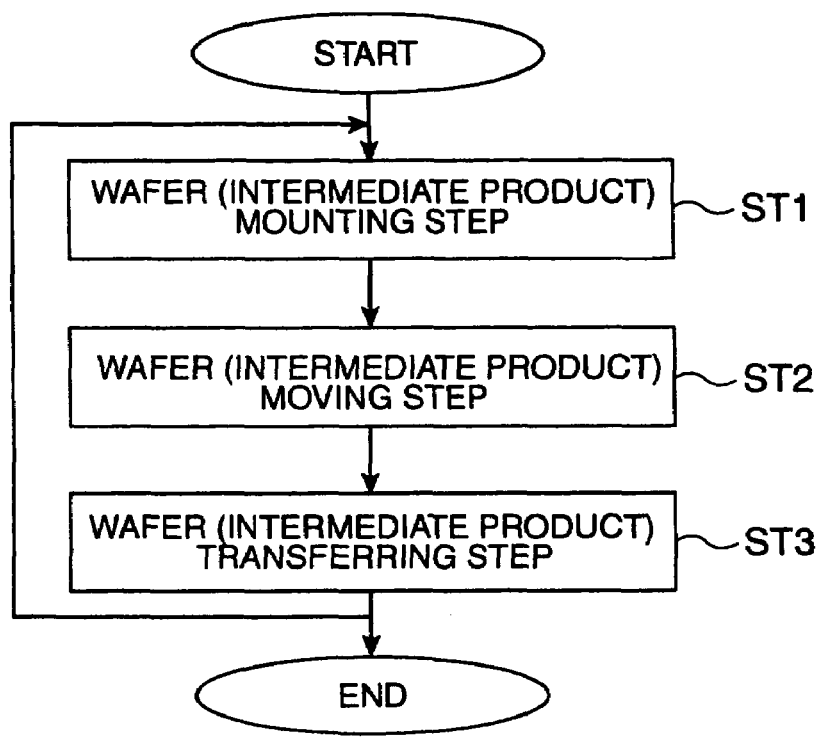
FIG. 15 is a flowchart showing a wafer carrying method.

Next, a wafer carrying method according to the present invention will be described with reference to FIGS. 1 and 15.

First, in an intermediate product mounting step ST1, the robots 21 mount at least one wafer on the wafer holding units 46 of the plurality of platforms 41 of the conveyer at a position in a direction crossing the carrying direction T of the wafers W on the conveyer 40.

Next, in an intermediate product moving step ST2, by moving the platforms 41 by means of the conveyer 40, the platforms are situated to face several manufacturing apparatuses 23 through 28 for the intermediate products.

Then, in a wafer transfer step ST3, the robots 21 transfer the wafers W on the platforms 41 to the manufacturing apparatuses 23 through 28.

As a result, it is possible to enhance the carrying amount of wafers W by means of the platforms 41 of the conveyer 40. In addition, the robots 21 can transfer the wafers W between the manufacturing apparatuses and the platforms.

In the embodiment of the present invention shown in FIG. 3, the wafers W can be stacked and held by the wafer holding units 46 to be parallel to the carrying direction T, that is, horizontally spaced. The direction in which the wafers W are stacked in spaced relationship is an upward direction (vertical direction) perpendicular to the carrying direction T of the wafers on the conveyer, i.e. above and parallel to the plane of the conveyor belt. Accordingly, since a plurality of wafers W can be held in spaced relationship, it is possible to enhance the carrying amount of wafers W.

In the embodiment shown in FIGS. 5 and 7, the respective wafers W are held in the provided wafer holding units 146 to be inclined with respect to the carrying direction T. Accordingly, it is possible to decrease the gap L between adjacent platforms 41. Therefore, it is possible to accomplish enhancement of the carrying amount of wafers W.

By employing the respective embodiments shown in FIGS. 3 and 7, even when the wafers subjected to several processes are carried on the same conveyer, it is possible to prevent attachment of particles or transfer of contaminants from a wafer with a large degree of contamination to a wafer with a small degree of contamination or to a clean wafer after cleaning.

An outer circumferential portion of a wafer W is held by the projections 51 of the wafer holding unit 46. As a result, since the projections 51 do not substantially come into contact with the wafer W, the wafer holding unit 46 can hold and carry the wafer W using sites not influencing the product.

In the embodiments of the present invention, when the wafer holding units 46 and 146 hold the wafers, a mechanical chuck method using the projections 51, etc. may be employed However, not limited to this, an electrostatic chuck method may be used for holding wafers.

As described in the embodiments of the present invention shown in FIGS. 5 and 7, by carrying the wafers in a non-horizontal state, the wafer mounting pitch on the conveyer can be reduced. Therefore, it is possible to accomplish enhancement of the carrying amount of wafers.

The wafers W may be carried to be approximately vertical to the carrying direction T. Accordingly, by carrying the wafers to be approximately vertical, it is possible to accomplish a decrease in the amount of dust, etc. attached to the wafers.

Each platform comprises a plurality of wafer holding units 46, and plural stages of the wafer holding units are provided in the Z direction, that is, in a vertical direction. Accordingly, when the number of stages of the wafer holding units is two, two times the amount of wafers can be carried, and when it is three, three times the amount of wafers can be carried. As a result, it is possible to enhance the carrying amount of wafers.

Wafer mounting positions on the conveyer can be divided in accordance with which platform of the plurality of platforms 41 is selected. Accordingly, it is possible to prevent attachment of particles or chemical contamination on the wafers with a relatively small degree of contamination.

By employing the wafer holding units 46 using a holding type as close to non-contact as possible, similarly to the examples shown in the figures, the wafers can be carried without consideration of the processes through which the wafers pass, so that it is also possible to reduce system management fees.

As shown in FIGS. 1 and 2, by partitioning the wafer carrying apparatus 20 into the small, closed space with the clean tunnel 30, there is merit as follows.

Conventionally, it was necessary that the whole semiconductor manufacturing apparatus 10 shown in FIG. 1 be arranged in a clean room to increase cleanliness. However, in the embodiments of the present invention, since it is effective in the clean tunnel 30 to maintain the cleanliness of only the inside of the very small, closed space through which the wafers pass, including the wafer carrying apparatus 20, it is possible to reduce the cost for maintaining cleanliness.

The present invention is not limited to the above embodiments, but various modifications may be made thereto without departing from the appended claims.

In the respective constructions of the above embodiments, some elements may be omitted or combined arbitrarily in ways unlike the above descriptions.

In the embodiments according to the present invention, the semiconductor wafers W are used as an example of intermediate products. However, the intermediate products are not limited thereto, but may also be substrates used for manufacturing electronic components or electronic products, or wafers for the substrates, and of course, may be substrates used for liquid crystal display devices or wafers for the substrates, or substrates used for crystal oscillators or wafers for the substrates. The electronic components mentioned above representatively include semiconductor devices, liquid crystal display devices, and crystal oscillators.

What is claimed is:

1. A method for carrying intermediate products, the method comprising:

an intermediate product mounting step in which at least one intermediate product is mounted by at least one robot on each of a plurality of platforms transported by a conveyer that carries the intermediate products in a carrying direction, each platform having a plurality of intermediate product holding units and each intermediate product holding unit having projections to detachably hold an intermediate product by supporting an outer circumferential edge of said intermediate product; and an intermediate product moving step in which the intermediate products are transported by the conveyor and situated to face manufacturing apparatuses;

an intermediate product transferring step in which at least one intermediate product is transferred by said at least one robot from each of said plurality of platforms to at least one of said manufacturing apparatuses for processing;

wherein the intermediate product holding units of each platform are arranged in a direction vertically perpendicular to the carrying direction of the intermediate products on the conveyer, each intermediate product holding unit holds the intermediate product parallel to the carrying direction of the intermediate products on the conveyer, and intermediate products are mounted in platforms according to a type of processing to be performed.

2. The method according to claim 1, wherein the intermediate products are electronic component manufacturing substrates or wafers for the substrates having major surfaces.

* * * * *